United States Patent
Whiteman

(10) Patent No.: US 7,498,800 B1
(45) Date of Patent: Mar. 3, 2009

(54) METHODS AND APPARATUS FOR ROTATIONALLY ACCESSED TESTER INTERFACE

(75) Inventor: Kenneth S. Whiteman, Portland, OR (US)

(73) Assignee: Advanced Inquiry Systems, Inc.

( * ) Notice: Subject to any disclaimer, the term of this patent is extended or adjusted under 35 U.S.C. 154(b) by 1 day.

(21) Appl. No.: 11/880,093

(22) Filed: Jul. 18, 2007

Related U.S. Application Data

(60) Provisional application No. 60/831,975, filed on Jul. 18, 2006.

(51) Int. Cl.
*G01R 31/28* (2006.01)

(52) U.S. Cl. .................... 324/158.1; 324/758

(58) Field of Classification Search .............. 324/158.1, 324/754, 758; 439/23, 152
See application file for complete search history.

(56) References Cited

U.S. PATENT DOCUMENTS

| | | | | |
|---|---|---|---|---|
| 5,023,561 A | * | 6/1991 | Hillard | ........................ 324/719 |
| 5,670,888 A | * | 9/1997 | Cheng | ......................... 324/754 |
| 5,852,300 A | * | 12/1998 | An | ......................... 250/559.22 |
| 5,982,166 A | * | 11/1999 | Mautz | ...................... 324/158.1 |
| 6,064,216 A | * | 5/2000 | Farnworth et al. | ........... 324/755 |
| 6,261,854 B1 | * | 7/2001 | Akram et al. | .................. 438/17 |
| 6,435,045 B1 | * | 8/2002 | Chen et al. | .................. 73/866.5 |
| 2007/0229105 A1 | * | 10/2007 | Johnson | ........................ 324/758 |

* cited by examiner

*Primary Examiner*—Ha Tran T Nguyen
*Assistant Examiner*—Richard Isla Rodas
(74) *Attorney, Agent, or Firm*—Raymond J. Werner

(57) ABSTRACT

A wafer/wafer translator pair in the attached state, with the wafer translator extending beyond the outer circumference of the wafer, is disposed on a rotation stage. At least one surface of the edge-extended wafer translator, in a peripheral annular region, provides contact pads electrically coupled to corresponding pads on the wafer, and a caliper-style contact block, operable to move perpendicularly the edge-extended wafer translator is positioned such the contact pads of the annular region may be electrically engaged with the contact block. After electrical communication between the wafer and the contact block, the contact block moves to a disengagement position, the rotation stage rotates the wafer/wafer translator pair to a new position and the contact block may then move into engagement with different contact pads in the annular region.

15 Claims, 5 Drawing Sheets

METHODS AND APPARATUS FOR ROTATIONALLY ACCESSED TESTER INTERFACE

CROSS-REFERENCE TO RELATED APPLICATIONS

This non-provisional application claims the benefit of provisional application 60/831,975, filed 18 Jul. 2006, and entitled "Methods And Apparatus For Rotationally Accessed Tester Interface", the entirety of which is hereby incorporated by reference.

FIELD OF THE INVENTION

The present invention relates generally to semiconductor test equipment, and more particularly relates to methods and apparatus for routing electrical conductors to and from integrated circuits, microelectromechanical systems (MEMS), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, planarizing, etching, and so on.

Completed wafers are tested to determine which die, or integrated circuits, on the wafer, are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive terminals, sometimes referred to as bond pads or probe pads, are commonly contacted with a probe card.

Today's tester technology often lacks the ability to test an entire wafer at one time. Therefore, most wafers are tested one or several die at a time. This less than full-wafer testing approach requires that the probes be stepped from one location on the wafer to another during the testing process in order to test the entire wafer. Current wafer probing technology requires very accurate placement of the probes onto the wafer to make electrical contact. Stepping the probes on the wafer requires that a high accuracy probing system be dedicated to each wafer under test. The cost and complexity of these probing systems has a large impact on the overall cost of producing the devices themselves.

What is needed are lower-cost, less-complex apparatus and methods to increase test efficiency.

SUMMARY OF THE INVENTION

Briefly, a full-wafer contact test apparatus providing for rotational access to electrical contacts disposed on an edge-extended wafer translator in an annular region lying outside the circumferential margin of a wafer under test, the edge-extended wafer translator and wafer, or similar substrate, to be tested being removably attached to each other, mounted on a rotation stage, and engaged with a caliper-style contact block.

In one aspect of the present invention removable attachment of wafer and edge-extended wafer translator is accomplished by pressure differential.

In a further aspect of the present invention, the caliper-style contact block is a zero insertion force socket.

In a still further aspect of the present invention the caliper-style contact block is a low insertion force socket.

DETAILED DESCRIPTION

Figure 1:
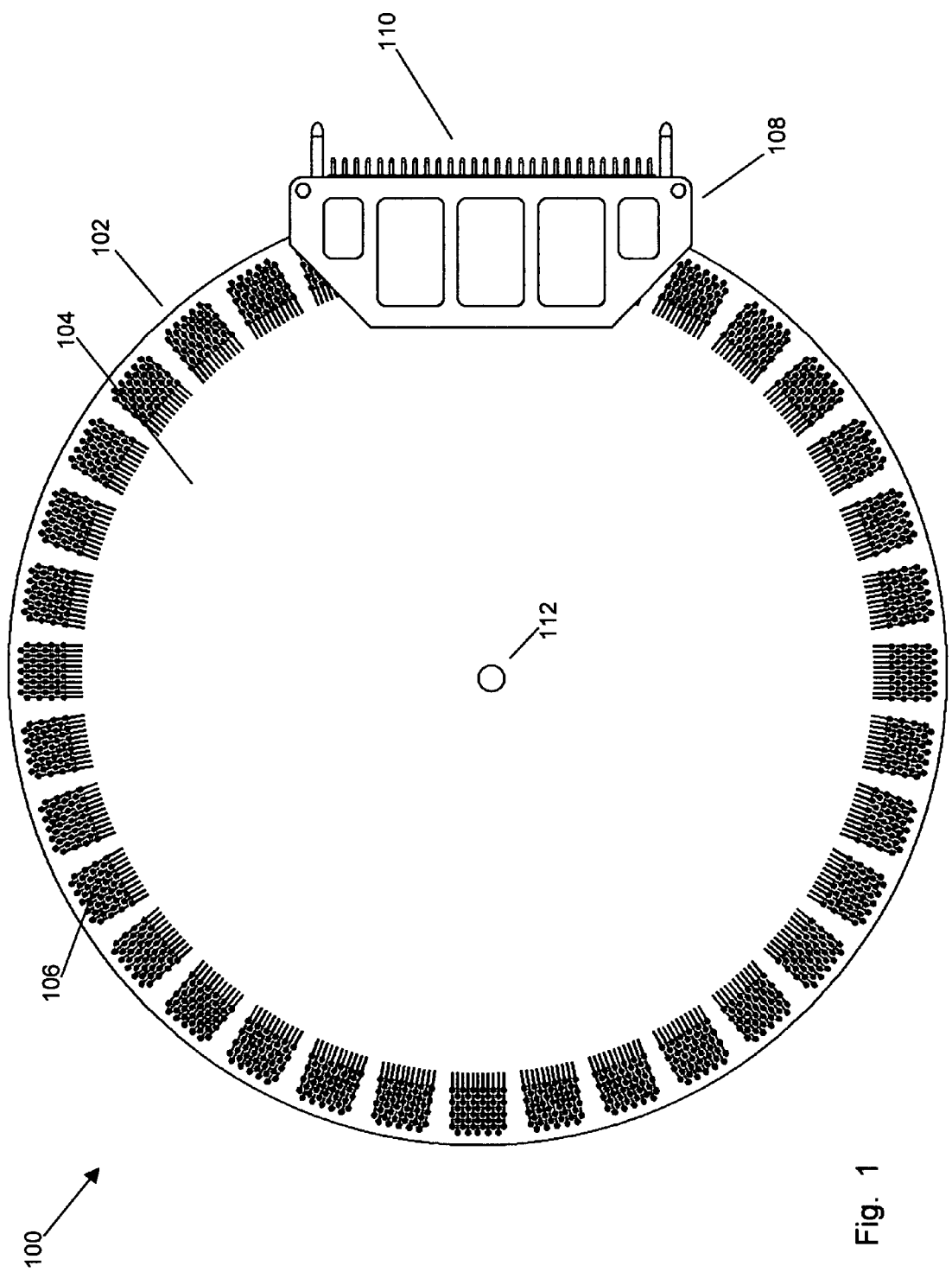
FIG. 1 is a schematic top-view representation of a rotationally accessed tester interface assembly with a single set of zero insertion force (ZIF) blocks.

Generally, a wafer/wafer translator pair in the attached state, with the wafer translator extending beyond the outer circumference of the wafer, is disposed on a rotation stage. At least one surface of the edge-extended wafer translator, in a peripheral annular region, provides contact pads electrically coupled to corresponding pads on the wafer, and a caliper-style contact block, operable to move perpendicularly the edge-extended wafer translator is positioned such the contact pads of the annular region may be electrically engaged with the contact block. After electrical communication between the wafer and the contact block, the contact block moves to a disengagement position, the rotation stage rotates the wafer/wafer translator pair to a new position and the contact block may then move into engagement with different contact pads in the annular region.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge-extended wafer translator" refers to an embodiment of a translator in which electrical pathways disposed In and/or on the translator lead from terminals, which in use contact the wafer under test, to electrical terminals disposed outside of a circumferential edge of a wafer.

The expression "translated wafer" refers to a wafer that has a wafer translator attached thereto, wherein a predetermined portion of, or all of, the contact pads (If the integrated circuits on the wafer are in electrical contact with corresponding electrical connection means disposed on the wafer side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIG. 1 is a schematic top-view representation of a rotationally accessed tester interface assembly 100, including a planar edge-extended wafer translator 102 and a wafer 104 under test. In this embodiment, a plurality of electrically conductive pads 106 disposed on the extended edge of an inquiry-side of planar edge-extended wafer translator 102 may be contacted by a block of probe pins 108. In this embodiment, rotational movement of planar edge-extended wafer translator 102 and wafer 104 around an axis 112 allows block 108 to sequentially contact all pads 106 on the extended edge of planar edge-extended wafer translator 102. In alternative embodiments, translator 102 and wafer 104 may remain stationary, while block 108 travels around peripheral areas of planar edge-extended wafer translator 102. Electrical signals may be conducted to or from block 108 and an external test apparatus or other device via cables 110. It will be appreciated that power can also be delivered to circuits on wafer 104 through block 108. In some embodiments, block 108 has probe pins mounted thereon which are brought into physical and electrical contact with a one portion of conductive pads 106 at a time. In other embodiments, block 108 may take the form of a zero insertion force (ZIF) socket, and pins extending perpendicularly from contact pads 106 of may be disposed on planar edge-extended wafer translator 102. In such an arrangement, the ZIF socket, once aligned with a particular set of pins, moves toward planar edge-extended wafer translator 102 to engage with those pins, and moves away to disengage from the pins.

In alternative embodiments, signals may be conducted wirelessly, or stored locally within the apparatus for subsequent access.

Figure 2:
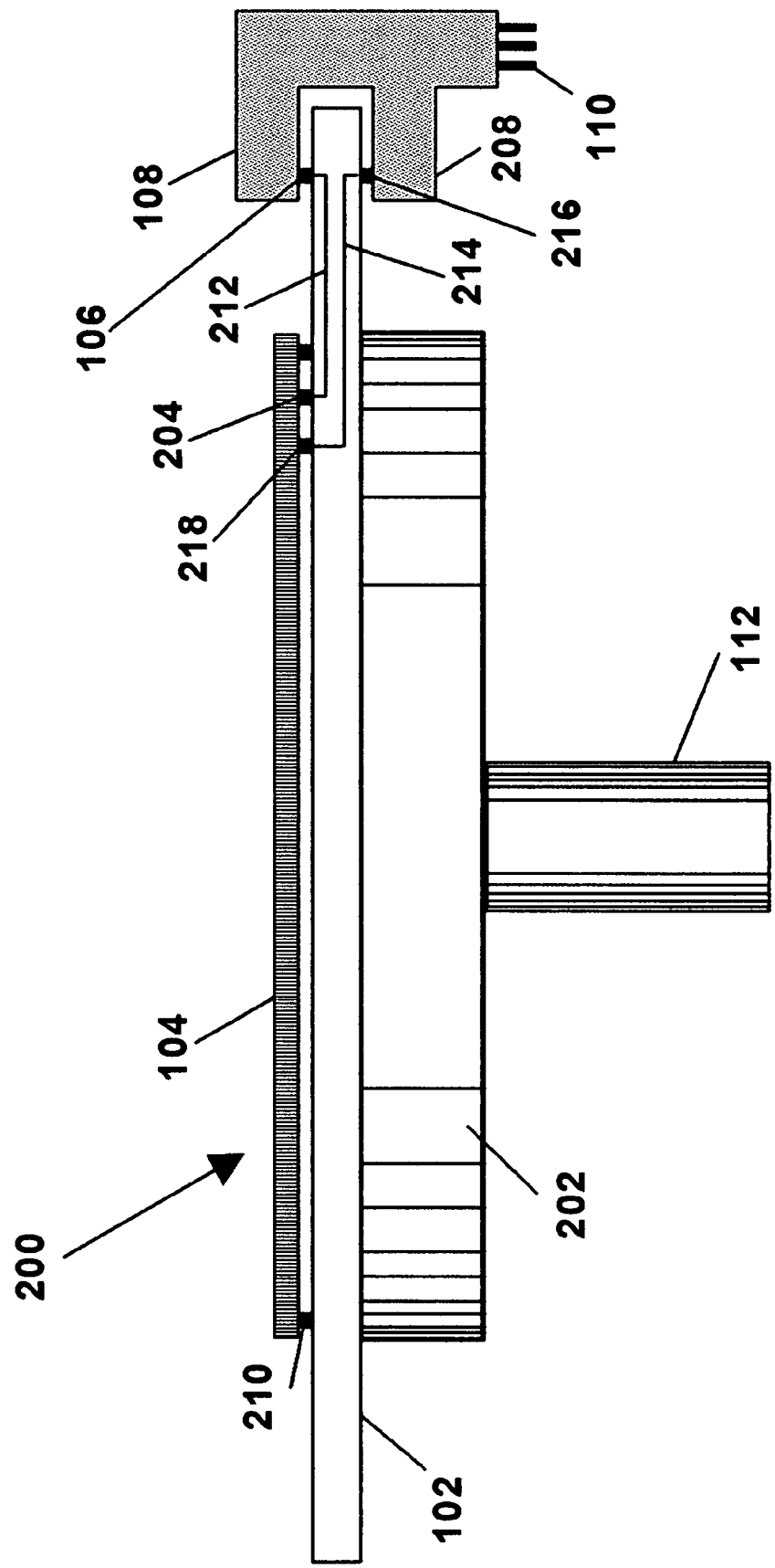
FIG. 2 is a schematic cross-sectional representation the rotationally accessed tester interface assembly described in FIG. 1.

FIG. 2 is a schematic cross-sectional representation of an embodiment of a rotationally accessed tester interface 200. Wafer 104 and planar edge-extended wafer translator 102 are typically removably attached to each other by means of a vacuum, or pressure differential between the atmosphere and the space enclosed by wafer 104, planar edge-extended wafer translator 102 and a gasket 210. The assembly of wafer 104 and planar edge-extended wafer translator 102 is mounted on rotation stage 202, which provides for movement around axis 112. In this embodiment, a plurality of wire paths 212 disposed within planar edge-extended wafer translator 102 lead from contact structures 204 disposed on a first major surface of planar edge-extended wafer translator 102 and corresponding to conductive pads on wafer 104, to a plurality of conductive test pads 106 disposed on the wafer-side of planar edge-extended wafer translator 102. In this embodiment, an additional plurality of wire paths 214 disposed within planar edge-extended wafer translator 102 lead from contact structures 218 disposed on planar edge-extended wafer translator 102 to a plurality of conductive test pads 216 disposed on a second major surface of planar edge-extended wafer translator 102. A second block 208 contacts pads 216. Electrical signals may be conducted to or from blocks 108 and 208 and an external test apparatus or other device via cables 110. In alternative embodiments, signals may be conducted wirelessly, or stored locally within the apparatus for subsequent access. It is noted that planar edge-extended wafer translator 102 may include wire pathways disposed within a multi-layer structure leading to conductive pads disposed on either or both major surfaces of a translator, or wire pathways printed upon either or both major surfaces of a translator.

Figure 3:
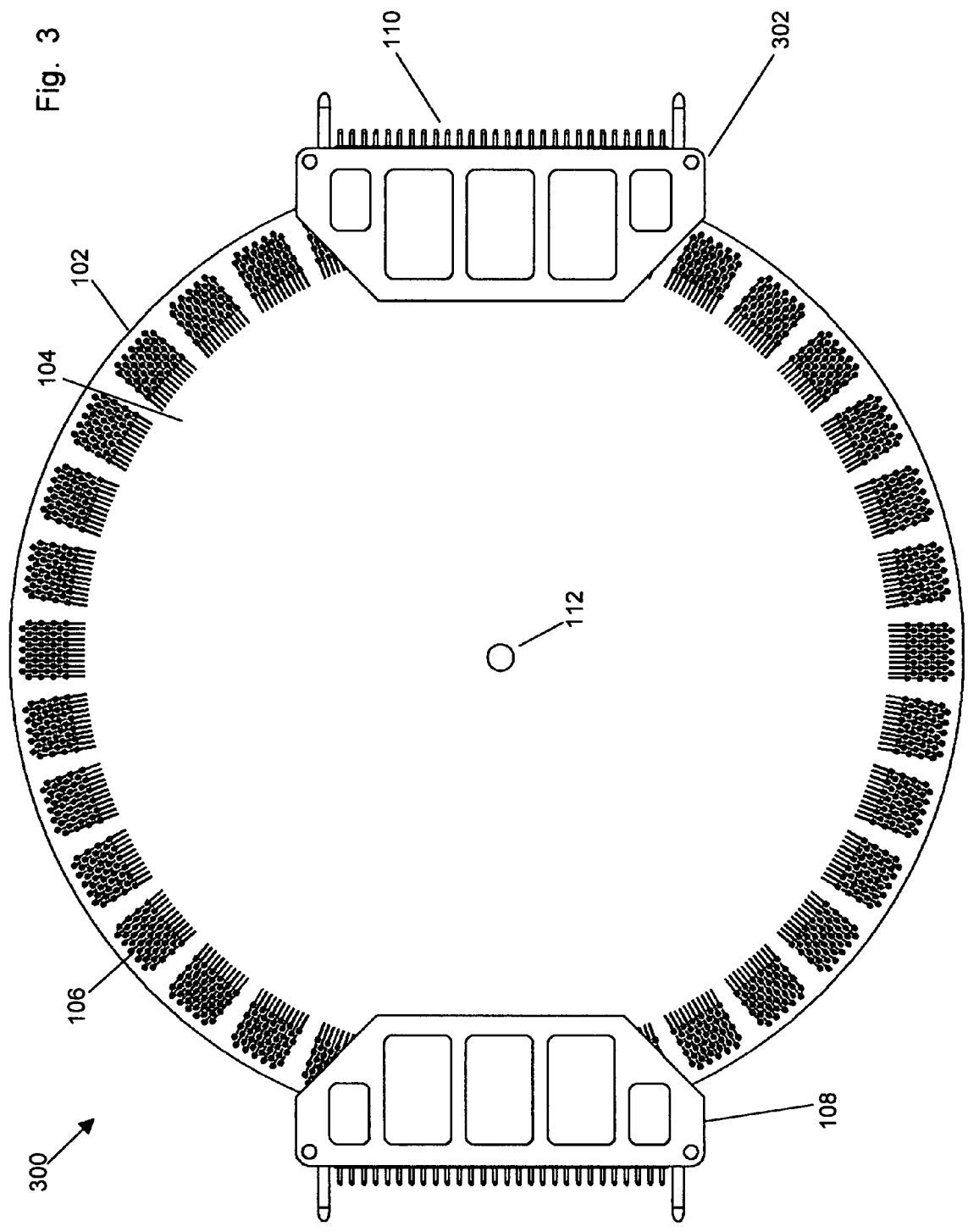
FIG. 3 is a schematic top-view representation of an alternative embodiment of a rotationally accessed tester interface assembly with two sets of ZIF blocks.

FIG. 3 is a schematic top-view representation of an alternative embodiment of a rotationally accessed tester interface assembly 300, including a planar edge-extended wafer translator 102 and a wafer 104 under test. In this embodiment, a second block 302 contacts pads 106 on planar edge-extended wafer translator 102. Rotational movement of planar edge-extended wafer translator 102 and wafer 104 around an axis 112 allows blocks 108 and 302 to contact all pads 106 on the extended edge of planar edge-extended wafer translator 102. In alternative embodiments, more than two such blocks may contact pads 106. It is noted that these blocks may be of varied pin counts and dimensions, and the present invention is not limited to any particular number of contacts, connections, or physical dimensions. It is further noted that alternative devices other than blocks 108, 208, 302 may be used to contact pads 106, such as a Low Insertion Force (LIF) block.

Figure 4:
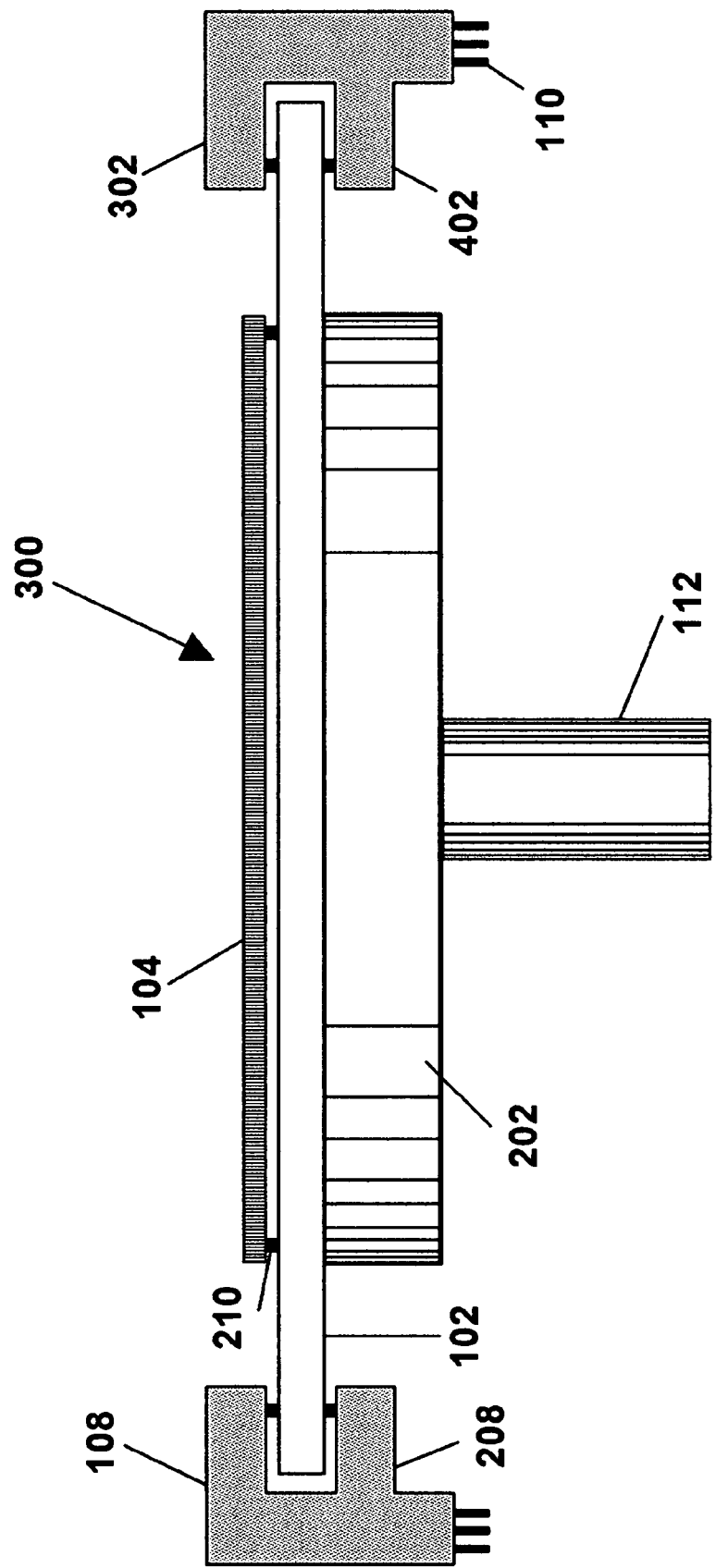
FIG. 4 is a schematic cross-sectional representation of the rotationally accessed tester interface assembly described in FIG. 3.

FIG. 4 is a schematic cross-sectional representation of a rotationally accessed tester interface assembly 300. As shown in FIG. 3, blocks 108 and 302 contact a first major surface of planar edge-extended wafer translator 102, and blocks 402 and 208 contact a second major surface of planar edge-extended wafer translator 102.

Figure 5:
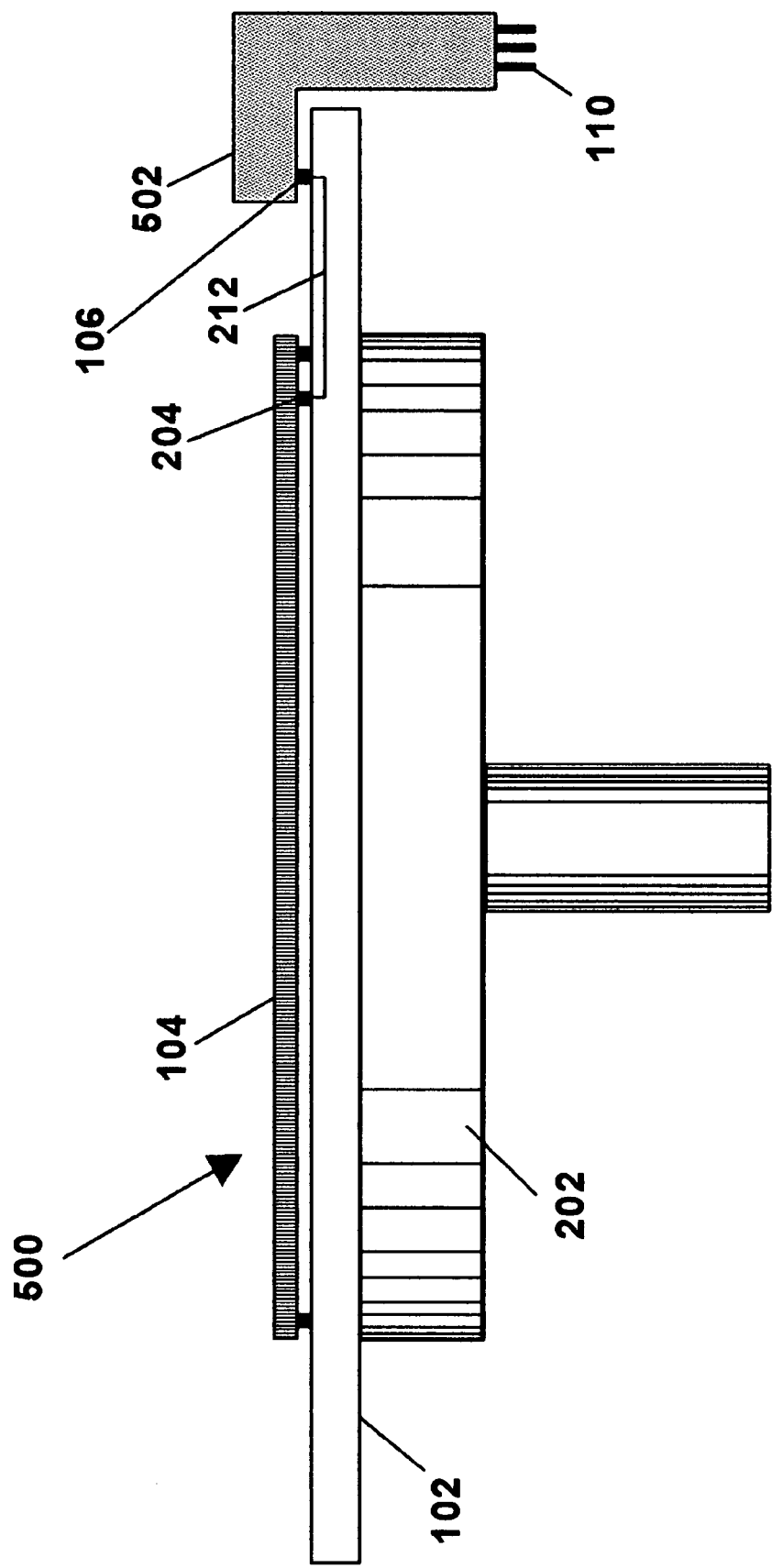
FIG. 5 is a schematic cross-sectional representation of an alternative embodiment of rotationally accessed tester interface assembly with contacts disposed on a single side of a planar edge-extended wafer translator.

FIG. 5 is a schematic cross-sectional representation of an alternative embodiment of rotationally accessed tester interface assembly 500 with contacts disposed on a single side of planar edge-extended wafer translator 102. The assembly of wafer 104 and planar edge-extended wafer translator 102 is mounted on rotation stage 202. In this embodiment, a plurality of wire paths 212 disposed within planar edge-extended wafer translator 102 lead from wafer contact structures 204 disposed on a major surface of planar edge-extended wafer translator 102 and corresponding to conductive pads on wafer 104, to a plurality of conductive test pads 106 disposed on the wafer-side of planar edge-extended wafer translator 102. Electrical signals may be conducted to or from blocks 108 and 208 and an external test apparatus or other device via cables 110. It is noted that wire paths may be disposed within, or printed upon a major surface of, planar edge-extended wafer translator 102.

In alternative embodiments, the edge-extended wafer translator may be non-planar in the annular region of its periphery outside the boundary defined by the removably attached wafer. In such an arrangement, the contact blocks that transmit and receive electrical signals and/or deliver power, are shaped so as to make electrical contact with the contact pads of the wafer translator.

CONCLUSION

It will be appreciated that the ability to lead contact arrays off the wafer in various configurations allows for a range of alternative embodiments beyond those represented in FIGS. 1-5.

The exemplary methods and apparatus illustrated and described herein find application in at least the field of integrated circuit test and analysis.

It is to be understood that the present invention is not limited to the embodiments described above, but encompasses any and all embodiments within the scope of the subjoined Claims and their equivalents.

What is claimed is:

1. A rotationally accessed tester interface, comprising:
    a rotation stage;
    an edge-extended wafer translator, having a first and a second major surface, disposed on the rotation stage; and
    a first contact block having a first portion positioned to overlap a peripheral annular region on a first major surface of the edge-extended wafer translator, and moveable, independent of the edge-extended wafer translator, in an axis perpendicular to the first major surface;
    wherein the edge-extended wafer translator includes contact pads disposed in a peripheral annular region of at least the first surface;
    wherein the first contact block includes a zero insertion force socket operable to receive pins extending perpendicularly from the first major surface of the edge-extended wafer translator.

2. The rotationally accessed tester interface of claim 1, wherein the edge-extended wafer translator is planar.

3. The rotationally accessed tester interface of claim 1, wherein the edge-extended wafer translator is non-planar in the peripheral annular region thereof.

4. The rotationally accessed tester interface of claim 1, wherein the first contact block includes pins extending outwardly from the first portion thereof toward the first major surface of the edge-extended wafer translator.

5. The rotationally accessed tester interface of claim 1, wherein the first contact block includes a second portion positioned to overlap a peripheral annular region on a second major surface of the edge-extended wafer translator, and operable to move in an axis perpendicular to the second major surface; wherein the first contact block further comprises pins extending outwardly from the second portion thereof toward the second major surface of the edge-extended wafer translator; and wherein the edge-extended wafer translator includes contact pads disposed in the peripheral annular region of the second major surface.

6. The rotationally accessed tester interface of claim 1, wherein the first contact block is coupled to one or more cables for electrical communication with at least one test apparatus.

7. The rotationally accessed tester interface of claim 1, further includes a second contact block having a first portion positioned to overlap the peripheral annular region on the first major surface of the edge-extended wafer translator, and operable to move in an axis perpendicular to the first major surface.

8. A method of electrically accessing one or more integrated circuits on a wafer, comprising:
    providing an edge-extended wafer translator, the edge-extended wafer translator having a first major surface and a second major surface;
    removably attaching the wafer to the first major surface of the edge-extended wafer translator, thereby forming a wafer/wafer translator pair, wherein the edge-extended wafer translator provides electrical pathways from the integrated circuits on the wafer to contact terminals on a peripheral annular region of the edge-extended wafer translator;
    providing a stage upon which the wafer/wafer translator pair is disposed; and
    moving a first contact block toward the edge-extended wafer translator in an axis perpendicular to the first major surface of the edge-extended wafer translator such that an electrical connection is established between the first contact block and the contact terminals on the peripheral annular region of the edge-extended wafer translator;
    wherein the first contact block includes a zero insertion force socket operable to receive pins extending perpendicularly from the first major surface of the edge-extended wafer translator.

9. The method of claim 8, further comprising:
moving the first contact block away from the edge-extended wafer translator in the axis perpendicular to the first major surface of the edge-extended wafer translator; and
rotating the wafer/wafer translator pair.

10. The method of claim 8, further comprising:
moving the first contact block away from the edge-extended wafer translator in the axis perpendicular to the first major surface of the edge-extended wafer translator; and
moving the first contact block in a path corresponding to the periphery of the edge-extended wafer translator.

11. The method of claim 10, wherein the path is substantially circular.

12. A rotationally accessed tester interface, comprising:
a rotation stage;
an edge-extended wafer translator, having a first and a second major surface, disposed on the rotation stage; and
a first contact block having a first portion positioned to overlap a peripheral annular region on a first major surface of the edge-extended wafer translator, and moveable, independent of the edge-extended wafer translator, in an axis perpendicular to the first major surface;
wherein the edge-extended wafer translator includes contact pads disposed in a peripheral annular region of at least the first surface;
wherein the first contact block includes a low insertion force socket operable to receive pins extending perpendicularly from the first major surface of the edge-extended wafer translator.

13. The rotationally accessed tester interface of claim 12, wherein the edge-extended wafer translator is planar.

14. The rotationally accessed tester interface of claim 12, wherein the first contact block includes pins extending outwardly from the first portion thereof toward the first major surface of the edge-extended wafer translator.

15. The rotationally accessed tester interface of claim 12, wherein the first contact block is coupled to one or more cables for electrical communication with at least one test apparatus.

\* \* \* \* \*